(12) United States Patent
Kim et al.

(10) Patent No.: US 9,099,326 B2
(45) Date of Patent: Aug. 4, 2015

(54) STACK-TYPE SEMICONDUCTOR PACKAGE

(71) Applicants: Yonghoon Kim, Suwon-si (KR); Keung Beum Kim, Hwaseong-si (KR); Inho Choi, Seoul (KR)

(72) Inventors: Yonghoon Kim, Suwon-si (KR); Keung Beum Kim, Hwaseong-si (KR); Inho Choi, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 48 days.

(21) Appl. No.: 14/099,860

(22) Filed: Dec. 6, 2013

(65) Prior Publication Data

US 2014/0246788 A1 Sep. 4, 2014

(30) Foreign Application Priority Data

Mar. 4, 2013 (KR) ........................ 10-2013-0022855

(51) Int. Cl.
*H01L 23/02* (2006.01)
*H01L 25/065* (2006.01)

(52) U.S. Cl.
CPC ... *H01L 25/0657* (2013.01); *H01L 2224/16225* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2924/15174* (2013.01); *H01L 2924/15192* (2013.01); *H01L 2924/15311* (2013.01)

(58) Field of Classification Search
USPC .................................. 257/686, 777, 723, 724
See application file for complete search history.

(56) References Cited

U.S. PATENT DOCUMENTS

| 5,319,600 | A | 6/1994 | Harada | |
|---|---|---|---|---|
| 7,286,386 | B2 | 10/2007 | Miwa et al. | |
| 7,777,348 | B2 | 8/2010 | Kodama et al. | |
| 8,097,956 | B2 | 1/2012 | Von Kaenel | |
| 8,928,132 | B2* | 1/2015 | Choi et al. | 257/686 |
| 8,952,517 | B2* | 2/2015 | Kwon et al. | 257/686 |
| 2006/0180943 | A1 | 8/2006 | Miwa et al. | |
| 2008/0157393 | A1 | 7/2008 | Kodama et al. | |
| 2010/0230825 | A1 | 9/2010 | Von Kaenel | |
| 2011/0298128 | A1 | 12/2011 | Schuetz | |
| 2012/0012844 | A1 | 1/2012 | Lee | |
| 2012/0056335 | A1 | 3/2012 | Gillingham | |
| 2012/0153282 | A1 | 6/2012 | Ishikawa et al. | |
| 2013/0161788 | A1* | 6/2013 | Chun et al. | 257/532 |
| 2014/0138851 | A1* | 5/2014 | Kim et al. | 257/777 |
| 2015/0048521 | A1* | 2/2015 | Kwon et al. | 257/777 |

FOREIGN PATENT DOCUMENTS

| KR | 20040017423 A | 2/2004 |
|---|---|---|
| KR | 20050041472 A | 5/2005 |

* cited by examiner

*Primary Examiner* — S. V. Clark
(74) *Attorney, Agent, or Firm* — Renaissance IP Law Group LLP

(57) ABSTRACT

Provided is a stack-type semiconductor package comprising a first semiconductor package with a first package substrate and a logic chip mounted thereon, a second semiconductor package including a second package substrate disposed on the first semiconductor package and first and second memory chips stacked on the second package substrate, and connection pads disposed between the first and second package substrates to connect the first and second semiconductor packages electrically to each other. The first package substrate has first and second edges that are substantially perpendicular to each other. The first package substrate may include first DQ connection pads electrically connected to the first memory chip, and second DQ connection pads electrically connected to the second memory chip. The first DQ connection pads may be arranged adjacent to the first edge and the second DQ connection pads may be arranged adjacent to the second edge.

20 Claims, 14 Drawing Sheets

STACK-TYPE SEMICONDUCTOR PACKAGE

CROSS-REFERENCE TO RELATED APPLICATIONS

This U.S. non-provisional patent application claims priority under 35 U.S.C. §119 to Korean Patent Application No. 10-2013-0022855, filed on Mar. 4, 2013, in the Korean Intellectual Property Office, the entire contents of which are hereby incorporated by reference.

BACKGROUND

Example embodiments of the disclosed subject matter relate to a stack-type semiconductor package, and in particular, to a stack-type semiconductor package including a pad structure capable of improving routability and characteristics of the package.

Recently, demand has increased for a single system with a plurality of processors or a multicore processor system in order to implement higher performance and more efficient portable electronic applications, such as a portable multimedia player (PMP), a mobile phone, a smart phone, a global positioning system (GPS), a navigation system, a digital camera, a digital video camera, or a personal digital assistant (PDA).

For example, as the result of user's requirement, there is an increasing demand for mobile phones with additional functions of playing music and movies, game console, taking pictures, or realizing payment, in addition to the basic phone function. Accordingly, there is a desire to integrate not only a communication processor, which is configured to perform communication modulation and demodulation, but also a media processor, which is configured to perform application functions, except the communication function, on a printed circuit board in the mobile phone. This may be achieved by stacking a plurality of semiconductor chips in a package or stacking one package on another package. For example, in a package-on-package (PoP) structure, one of the stacked packages may include a plurality of semiconductor chips. In this case, since the plurality of the semiconductor chips should be electrically connected to each other within one package, a wiring structure of the device may become complex: that is, the device may suffer from decreased routability.

SUMMARY

Example embodiments of the disclosed subject matter provide a stack-type semiconductor package, in which a pad structure is configured to improve routability and characteristics of the package.

According to example embodiments of the disclosed subject matter, a stack-type semiconductor package may include a first semiconductor package including a first package substrate and a logic chip mounted thereon, the first package substrate having first and second edges that are substantially perpendicular to each other, a second semiconductor package including a second package substrate disposed on the first semiconductor package and first and second memory chips stacked on the second package substrate and electrically connected to the logic chip, and connection pads disposed between the first and second package substrates to connect the first and second semiconductor packages electrically to each other. The first package substrate may include first data (DQ) connection pads and first command and address (CA) connection pads electrically connected to the first memory chip and disposed opposite each other, and second DQ connection pads and second CA connection pads electrically connected to the second memory chip and disposed opposite each other. The first DQ connection pads may be arranged adjacent to the first edge and the second DQ connection pads may be arranged adjacent to the second edge.

In example embodiments, the logic chip may include first data pads and first command/address pads electrically connected to the first memory chip and disposed opposite each other, and second data pads and second command/address pads connected to the second memory chip and disposed opposite each other. The first data pads may be disposed adjacent to the first DQ connection pads and the second data pads may be disposed adjacent to the second DQ connection pads.

In example embodiments, the first DQ connection pads may be disposed adjacent to the second CA connection pads.

In example embodiments, each of the first and second memory chips may include data pads and command/address pads that may be disposed opposite each other, the data and command/address pads of the first memory chip may be arranged parallel to the first edge, and the data and command/address pads of the second memory chip may be arranged parallel to the second edge.

In example embodiments, the second semiconductor package may further include a third memory chip mounted on the second package substrate to be disposed at a side of the first memory chip, and a fourth memory chip stacked on the first memory chip to be disposed at a side of the second memory chip.

In example embodiments, each of the third and fourth memory chips may include data pads and command/address pads disposed opposite each other, the data and command/address pads of the third memory chip may be arranged parallel to the first edge, and the data and command/address pads of the fourth memory chip may be arranged parallel to the second edge.

In example embodiments, the first package substrate may further include third DQ connection pads and third CA connection pads electrically connected to the third memory chip and disposed opposite each other, and fourth DQ connection pads and fourth CA connection pads electrically connected to the fourth memory chip and disposed opposite each other. The third DQ connection pads may be arranged adjacent to the first edge and the fourth DQ connection pads may be arranged adjacent to the second edge.

In example embodiments, the third DQ connection pads may be disposed adjacent to the fourth CA connection pads.

According to example embodiments of the disclosed subject matter, a stack-type semiconductor package may include a first semiconductor package including a first package substrate and a logic chip mounted thereon, the first package substrate having first and second edges that may be substantially perpendicular to each other, a second semiconductor package including a second package substrate disposed on the first semiconductor package and first to fourth memory chips mounted on the second package substrate and electrically connected to the logic chip, and connection pads disposed between the first and second package substrates to connect the first and second semiconductor packages electrically to each other. The logic chip may include first to fourth data pads and first to fourth command/address pads electrically connected to the first to fourth memory chips, the first data pads and the third command/address pads may be arranged adjacent to the first edge, and the second data pads and the fourth command/address pads may be arranged adjacent to the second edge.

In example embodiments, the first command/address pads may be disposed opposite the first data pads, the third data pads may be disposed opposite the third command/address pads, the second command/address pads may be disposed opposite the second data pads, and the fourth data pads may be disposed opposite the fourth command/address pads.

In example embodiments, in plan view, the first data pads may be disposed on a line diagonally or slantingly going through the third data pads, and the second data pads may be disposed on a line diagonally or slantingly going through the fourth data pads.

In example embodiments, the first data pads may be disposed adjacent to the second command/address pads, and the third command/address pads may be disposed adjacent to the fourth data pads.

In example embodiments, each of the first and second package substrates may include first to fourth DQ connection pads and first to fourth CA connection pads. The first DQ connection pads and the third CA connection pads may be arranged adjacent to the first edge, and the second DQ connection pads and the fourth CA connection pads may be arranged adjacent to the second edge.

In example embodiments, each of the first to fourth memory chips may include data pads and command/address pads disposed opposite each other. The first and second memory chips may be mounted on a top surface of the second package substrate in such a way that the data pads of the first and second memory chips are disposed opposite each other. The third and fourth memory chips may be stacked on top surfaces of the first and second memory chips in such a way that the data pads of the third and fourth memory chips are disposed opposite each other and to be not parallel to the first and second data pads.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
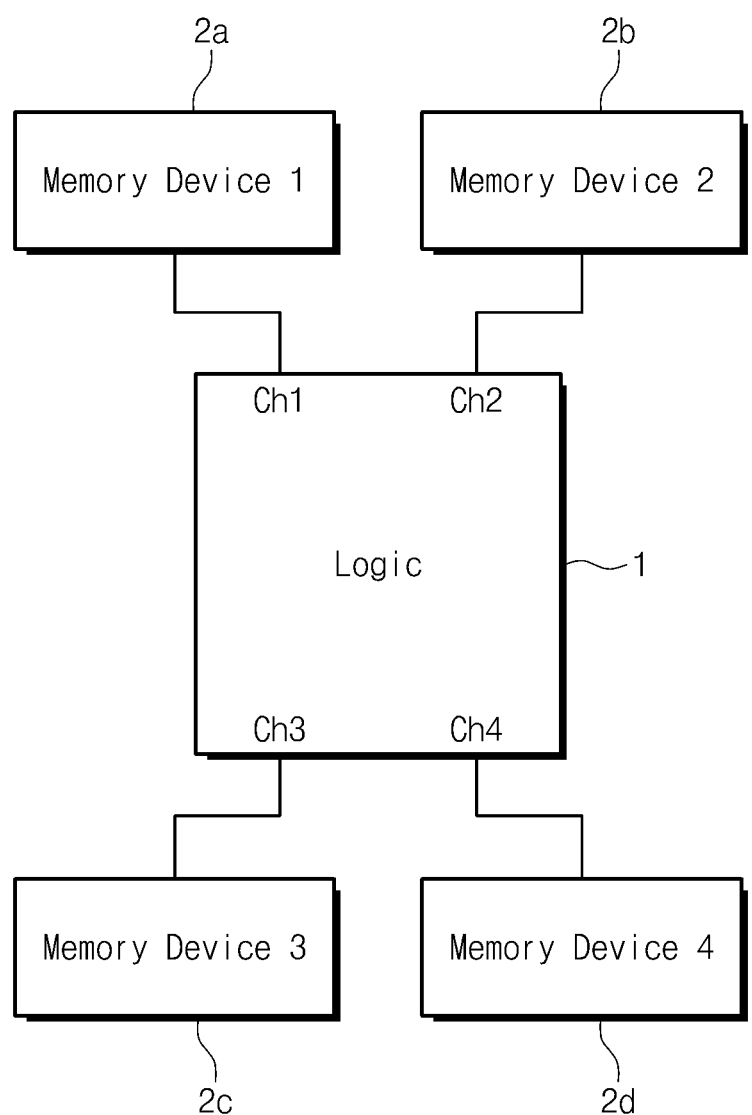
FIG. 1 is a schematic diagram illustrating a stack-type semiconductor package according to example embodiments of the disclosed subject matter.

It should be noted that these figures are intended to illustrate the general characteristics of methods, structure and/or materials utilized in certain example embodiments and to supplement the written description disposed below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the disclosed subject matter will now be described more fully with reference to the accompanying drawings, in which example embodiments are shown. Example embodiments of the disclosed subject matter may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the disclosed subject matter belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic diagram illustrating a stack-type semiconductor package according to example embodiments of the disclosed subject matter.

Referring to FIG. 1, a stack-type semiconductor package may include a logic device 1 and a plurality of memory devices (e.g., first to fourth memory devices 2a, 2b, 2c, and 2d). In example embodiments, the logic device 1 and the memory devices 2a, 2b, 2c, and 2d may be semiconductor chips that are individually packaged.

The logic device 1 may be, for example, a photoelectron device, a communication device, a digital signal processor, a controller, or a system-on-chip. In example embodiments, the logic device 1 may be a digital baseband modem processor and/or an analog baseband modem processor. In other embodiments, the logic device 1 may be a media processor, which may be configured to process communication data or entertainment data (e.g., game data) or a microprocessor.

The memory devices 2a, 2b, 2c, and 2d may be one of, for example, double data rate synchronous dynamic random-access memory (DDR SDRAM), DDR2 DRAM, DDR3 DRAM, mobile DRAM, EDP, Phase-change RAM (PRAM), OneDRAM, Pseudo SRAM, low power DDR (LpDDR) DRAM, Ferroelectric RAM (FRAM), Graphic DRAM, Spin-transfer torque RAM (STT-RAM) or Resistive RAM (ReRAM). Alternatively, the first to fourth memory devices 2a, 2b, 2c, and 2d may be one of NAND flash, NOR flash, OneNAND, PRAM, or ReRAM.

The memory devices 2a, 2b, 2c, and 2d may be configured to have the same operational property or different operational properties from each other. For example, the memory devices 2a, 2b, 2c, and 2d may be DRAM devices or be FLASH memory devices. Alternatively, the first and fourth memory devices 2a and 2d may be DRAM devices, while the second and third memory devices 2b and 2c may be FLASH memory devices.

The logic device 1 and the memory devices 2a, 2b, 2c, and 2d may be connected to each other through channels Ch1, Ch2, Ch3, and Ch4. In example embodiments, the logic device 1 may include a plurality of channels (e.g., Ch1, Ch2, Ch3, and Ch4, etc.), each of which may be configured to control independently a corresponding one of the memory devices 2a, 2b, 2c, and 2d. The channels Ch1, Ch2, Ch3, and Ch4 may be configured to transmit command/address signals and data signals to the memory devices 2a, 2b, 2c, and 2d. Each of the channels Ch1, Ch2, Ch3, and Ch4 may include data pads for sending and receiving data signals and command/address pads for sending and receiving command/address signals. Each of the channels Ch1, Ch2, Ch3, and Ch4 may be configured to interface data signals of 16 bits or 32 bits.

In example embodiments, the first channel Ch1 may be configured to transmit command/address signals and data signals to the first memory device 2a, and the second channel Ch2 may be configured to transmit command/address signals and data signals to the second memory device 2b. The third channel Ch3 may be configured to transmit command/address signals and data signals to the third memory device 2c, and the fourth channel Ch4 may be configured to transmit command/address signals and data signals to the fourth memory device 2d. As shown in FIG. 1, each of the channels Ch1, Ch2, Ch3, and Ch4 may be connected to the corresponding one of the memory devices. Alternatively, each of the channels Ch1, Ch2, Ch3, and Ch4 may be connected to two or more memory devices.

When the logic device 1 and the memory devices 2a, 2b, 2c, and 2d are packaged, it may be necessary to configure each memory chip, to which data, command, or address signals can be independently applied. Since large data processing capacity and high performance are desirable for the logic devices 1, input/output (I/O) pins of each logic device 1 may be more than and different from those of the memory chip. Accordingly, an interconnection structure between the memory and logic chips may be relatively complex, when the memory and logic chips are mounted in a single semiconductor package. In addition, if a plurality of memory chips are vertically stacked to form a semiconductor package, the overall thickness of the semiconductor package may be increased. Accordingly, it may be desirable to simplify the interconnection structure between the memory and logic chips in each semiconductor package.

Figure 2:
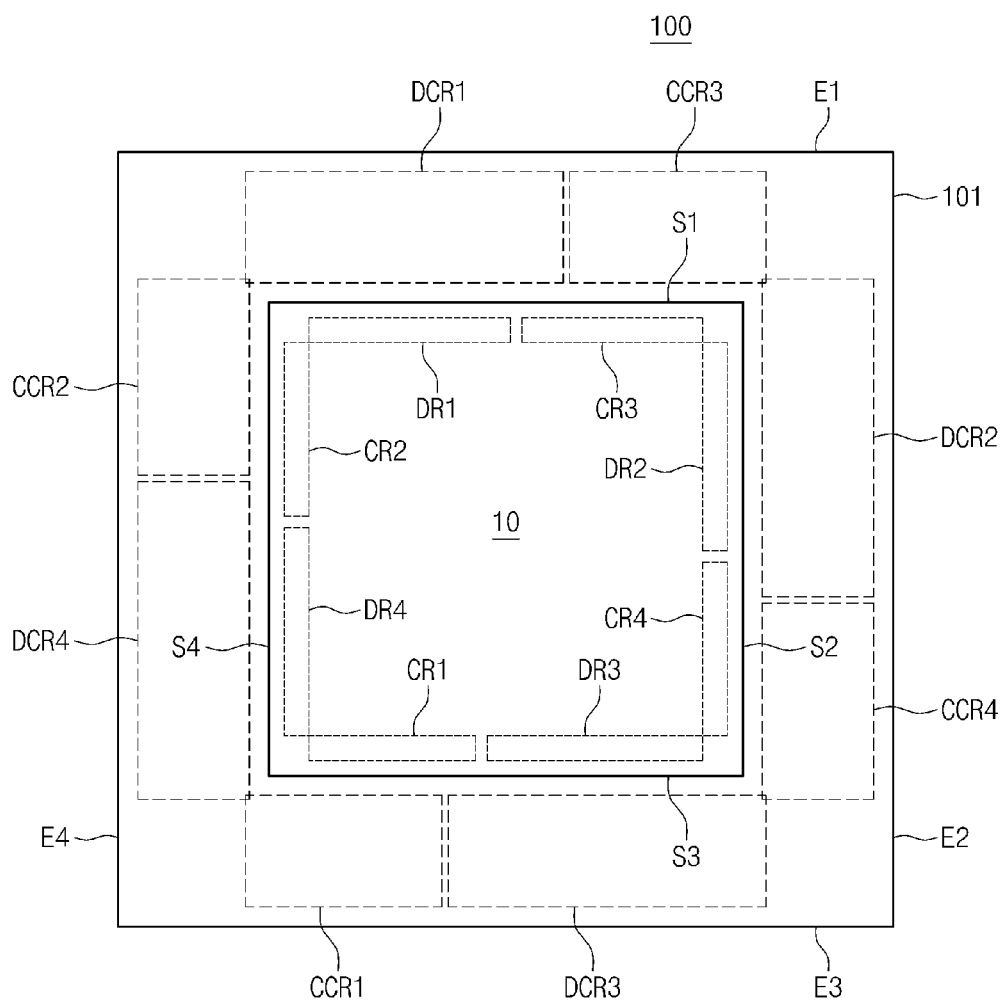
FIG. 2 is a schematic plan view of a first semiconductor package according to example embodiments of the disclosed subject matter.

FIG. 2 is a schematic plan view of a first semiconductor package including a logic chip, according to example embodiments of the disclosed subject matter.

Referring to FIG. 2, a first semiconductor package 100 may include a first package substrate 101 and a logic chip 10 mounted on the first package substrate 101.

The logic chip 10 may include first, second, third, and fourth side surfaces S1, S2, S3, and S4 (respectively), where the first and second side surfaces S1 and S2 are substantially perpendicular to each other. The first and third side surfaces S1 and S3 may be disposed opposite each other, and the second and fourth side surfaces S2 and S4 may be disposed opposite each other.

In example embodiments, the logic chip 10 may include first, second, third, and fourth data pad regions DR1, DR2, DR3, and DR4 and first, second, third, and fourth command/address (CA) pad regions CR1, CR2, CR3, and CR4.

The first data pad region DR1 and the first command/address pad region CR1 may be opposite each other. The first data pad region DR1 may be disposed adjacent to the first side surface S1, and the first command/address pad region CR1 may be disposed adjacent to the third side surface S3. The first data pad region DR1 may have an area greater than that of the first command/address pad region CR1.

The second data pad region DR2 and the second command/address pad region CR2 may be opposite each other. The second data pad region DR2 may be disposed adjacent to the second side surface S2, and the second command/address pad region CR2 may be disposed adjacent to the fourth side surface S4. The second data pad region DR2 may have an area t greater than that of the second command/address pad region CR2. Further, the second data pad region DR2 may be disposed adjacent to the third command/address pad region CR3 of the first side surface S1, and the second command/address pad region CR2 may be disposed adjacent to the first data pad region DR1 of the first side surface S1.

The third data pad region DR3 and the third command/address pad region CR3 may be disposed opposite each other. The third data pad region DR3 may be disposed adjacent to the third side surface S3, and the third command/address pad region CR3 may be disposed adjacent to the first side surface S1. The third data pad region DR3 may have an area greater than that of the third command/address pad region CR3. For example, the first data pad region DR1 and the third command/address pad region CR3 may be disposed adjacent to the first side surface S1 of the logic chip 10, and the third data pad region DR3 and the first command/address pad region CR1 may be disposed adjacent to the third side surface S3 of the logic chip 10.

The fourth data pad region DR4 and the fourth command/address pad region CR4 may be disposed opposite each other. The fourth data pad region DR4 may be disposed adjacent to the fourth side surface S4, and the fourth command/address pad region CR4 may be disposed adjacent to the second side surface S2. The fourth data pad region DR4 may have an area greater than that of the fourth command/address pad region CR4. The fourth data pad region DR4 may be disposed adjacent to the first command/address pad region CR1 of the third side surface S3, and the fourth command/address pad region CR4 may be disposed adjacent to the third data pad region DR3 of the second side surface S2. In other words, the second data pad region DR2 and the fourth command/address pad region CR4 may be disposed adjacent to the second side surface S2 of the logic chip 10, and the fourth data pad region DR4 and the second command/address pad region CR2 may be disposed adjacent to the fourth side surface S4 of the logic chip 10.

Further, referring to FIG. 2, the first package substrate 101 may be configured to have first, second, third, and fourth edges E1, E2, E3, and E4, where the first and second edges E1 and E2 may be substantially perpendicular to each other. The first and third edges E1 and E3 may be opposite each other, and the second and fourth edges E2 and E4 may be opposite each other. In example embodiments, the logic chip 10 may be mounted on the first package substrate 101 in such a way that the first edge E1 of the first package substrate 101 is substantially parallel to the first side surface S1 of the logic chip 10.

The first package substrate 101 may include first, second, third, and fourth data (DQ) connection pad regions DCR1, DCR2, DCR3, and DCR4 and first, second, third, and fourth command and address (CA) connection pad regions CCR1, CCR2, CCR3, and CCR4.

The first DQ connection pad region DCR1 and the first CA connection pad region CCR1 may be opposite each other. The first DQ connection pad region DCR1 may be disposed adjacent to the first edge E1 and the first CA connection pad region CCR1 may be disposed adjacent to the third edge E3. The first DQ connection pad region DCR1 may be disposed adjacent to the first data pad region DR1 of the logic chip 10, and the first CA connection pad region CCR1 may be disposed adjacent to the first command/address pad region CR1 of the logic chip 10. The first DQ connection pad region DCR1 may have an area greater than that of the first CA connection pad region CCR1.

The second DQ connection pad region DCR2 and the second CA connection pad region CCR2 may be opposite each other. The second DQ connection pad region DCR2 may be disposed adjacent to the second edge E2 and the second CA connection pad region CCR2 may be disposed adjacent to the fourth edge E4. The second DQ connection pad region DCR2 may be disposed adjacent to the second data pad region DR2 of the logic chip 10, and the second CA connection pad region CCR2 may be disposed adjacent to the second command/address pad region CR2 of the logic chip 10. Furthermore, the second CA connection pad region CCR2 may be disposed adjacent to the fourth DQ connection pad region DCR4. Also, the second CA connection pad region CCR2 may be disposed adjacent to the first DQ connection pad region DCR1 with a corner of the 1st semiconductor package therebetween. The second DQ connection pad region DCR2 may have an area greater than that of the second CA connection pad region CCR2.

The third DQ connection pad region DCR3 and the third CA connection pad region CCR3 may be opposite each other. The third DQ connection pad region DCR3 may be disposed adjacent to the third edge E3 and the third CA connection pad region CCR3 may be disposed adjacent to the first edge E1. The third DQ connection pad region DCR3 may be disposed adjacent to the third data pad region DR3 of the logic chip 10, and the third CA connection pad region CCR3 may be disposed adjacent to the third command/address pad region CR3 of the logic chip 10. The third DQ connection pad region DCR3 may have an area greater than that of the third CA connection pad region CCR3.

The fourth DQ connection pad region DCR4 and the fourth CA connection pad region CCR4 may be opposite each other. The fourth DQ connection pad region DCR4 may be disposed adjacent to the fourth edge E4 and the fourth CA connection pad region CCR4 may be disposed adjacent to the second edge E2. The fourth DQ connection pad region DCR4 may be disposed adjacent to the fourth data pad region DR4 of the logic chip 10, and the fourth CA connection pad region CCR4 may be disposed adjacent to the fourth command/address pad region CR4 of the logic chip 10. Furthermore, the fourth CA connection pad region CCR4 may be disposed adjacent to the second DQ connection pad region DCR2. Also, the fourth CA connection pad region CCR4 may be disposed adjacent to the third DQ connection pad region DCR3 with a corner of the 1st semiconductor package therebetween. The fourth DQ connection pad region DCR4 may have an area greater than that of the fourth CA connection pad region CCR4.

Figure 3:
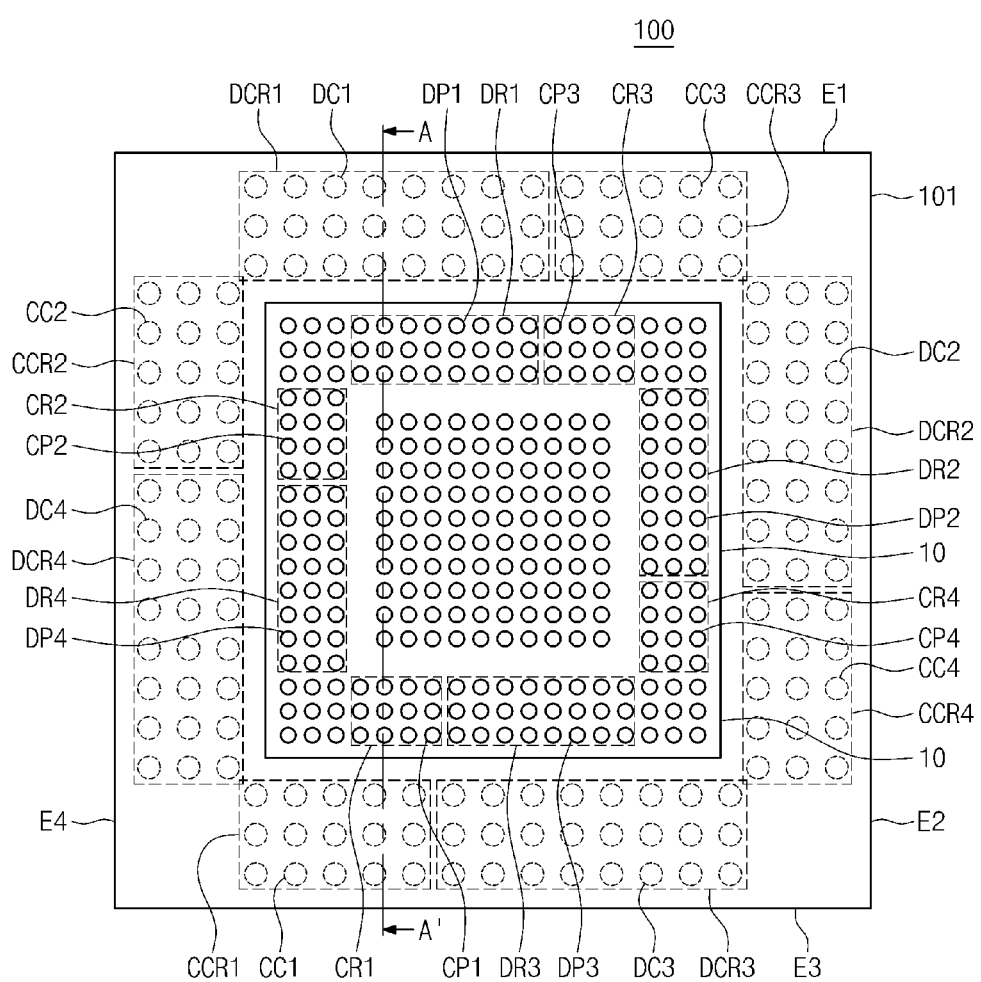
FIG. 3 is a plan view illustrating the first semiconductor package according to example embodiments of the disclosed subject matter.
Figure 4:
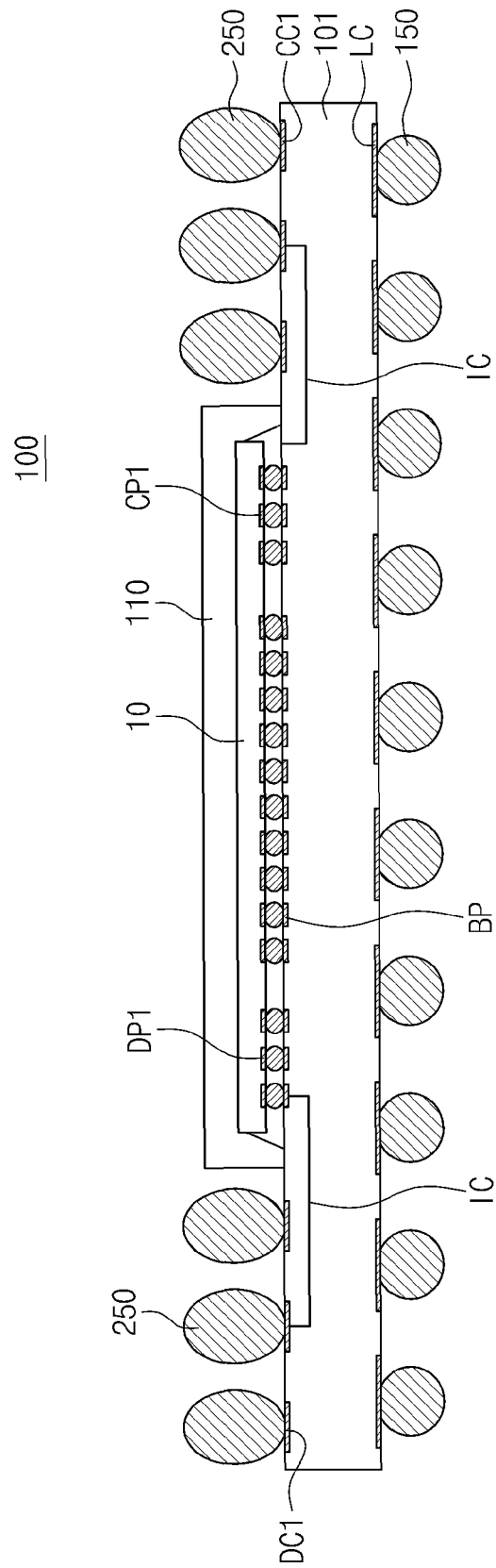
FIG. 4 is a sectional view taken along a line A-A' of FIG. 3 to illustrate the first semiconductor package according to example embodiments of the disclosed subject matter.

FIG. 3 is a plan view illustrating the first semiconductor package according to example embodiments of the disclosed subject matter. FIG. 4 is a cross-sectional view taken along a line A-A' of FIG. 3 to illustrate the first semiconductor package according to example embodiments of the disclosed subject matter.

Referring to FIGS. 3 and 4, the logic chip 10 may include data pads DP1, DP2, DP3, and DP4, which may be configured to input and output data signals to and from the memory chip, command/address pads CP1, CP2, CP3, and CP4, which may be configured to input and output command and address signals to and from the memory chip, and power and ground pads, which are applied with ground and power voltages, respectively.

In example embodiments, the logic chip 10 may include the first, second, third, and fourth data pads DP1, DP2, DP3, and DP4 and the first, second, third, and fourth command/address pads CP1, CP2, CP3, and CP4. As described with reference to FIG. 1, the logic chip 10 may include the first, second, third, and fourth channels Ch1, Ch2, Ch3, and Ch4. For example, the first data pads DP1 and the first command/address pads CP1 may constitute a first channel, the second data pads DP2 and the second command/address pads CP2 may constitute a second channel. Similarly, the third data pads DP3 and the third command/address pads CP3 may constitute a third channel, and the fourth data pads DP4 and the fourth command/address pads CP4 may constitute a fourth channel.

The first data pads DP1 may be disposed on the first data pad region DR1 of the logic chip 10, and the first command/address pads CP1 may be disposed on the first command/address pad region CR1. Similarly, the second, third, and fourth data pads DP2, DP3, and DP4 may be disposed on the second, third, and fourth data pad regions DR2, DR3, and DR4, respectively, and the second, third, and fourth command/address pads CP2, CP3, and CP4 may be disposed on the second, third and fourth command/address pad regions CR2, CR3, and CR4, respectively.

The logic chip 10 may be mounted on the first package substrate 101 and electrically connected thereto using a wire bonding technique or flip-chip bonding technique. In the present embodiments, the logic chip 10 may be connected using a flip-chip bonding technique. For example, the data pads DP1, DP2, DP3, and DP4 and the command/address pads CP1, CP2, CP3, and CP4 of the logic chip 10 may be used as bump pads, to which bumps will be attached. In other words, the mounting of the logic chip 10 on the first package substrate 101 may be accomplished by conductive bumps connecting the data pads DP1, DP2, DP3, and DP4 and the command/address pads CP1, CP2, CP3, and CP4 to bonding pads of the first package substrate 101.

In example embodiments, the logic chip 10 may include or be a photoelectron device, a communication device, a microprocessor, a digital signal processor, a controller, and/or a system-on-chip. For example, the semiconductor the logic chip 10 may be a digital baseband modem chip and/or an analog baseband modem chip. It is understood that the above is merely one illustrative example to which the disclosed subject matter is not limited.

Next, referring to FIGS. 3 and 4, a variety of substrates, such as a printed circuit board, a flexible substrate, and a tape substrate, etc., may be used as the first package substrate 101. In example embodiments, the first package substrate 101 may be a flexible printed circuit board, a rigid printed circuit board, or combinations thereof, in which internal wires IC are provided.

The first package substrate 101 may have a top surface and a bottom surface and include bonding pads BP, DQ connection pads DC1-DC4 and CA connection pads CC1-CC4, lower connection pads LC, and internal wires IC. As shown in FIG. 4, the bonding pads BP, the DQ connection pads DC1-DC4 and the CA connection pads CC1-CC4 may be arranged on the top surface of the first package substrate 101, and the lower connection pads LC may be arranged on the bottom surface of the first package substrate 101.

In more detail, the DQ connection pads DC1-DC4 and the CA connection pads CC1-CC4 may be disposed around the logic chip 10 and be electrically connected to the bonding pads BP through the internal wires IC. Further, the DQ connection pads DC1-DC4 and the CA connection pads CC1-CC4 may be electrically connected to the lower connection pads LC via the internal wires IC. The bonding pads BP may be disposed on a substantially central region of the first package substrate 101, where the logic chip 10 may be mounted, and be connected to the first, second, third, and fourth data pads DP1, DP2, DP3, and DP4 and the first, second, third, and fourth command/address pads CP1, CP2, CP3, and CP4 of the logic chip 10 through bumps. The bonding pads BP may be electrically connected to the DQ connection pads DC1-DC4 and the CA connection pads CC1-CC4 via the internal wires IC. Connection terminals 250, such as solder balls or solder bumps, may be attached on the DQ connection pads DC1-DC4 and the CA connection pads CC1-CC4. In addition, outer connection terminals 150, such as solder balls or solder bumps, may be attached on the lower connection pads LC.

In example embodiments, the DQ connection pads DC1-DC4 may be disposed on the first, second, third, and fourth DQ connection pad regions DCR1-DCR4 of the first package substrate 101 described with reference to FIG. 2, and the CA connection pads CC1-CC4 may be disposed on the first, second, third, and fourth CA connection pad regions CCR1-CCR4. For example, the first DQ connection pads DC1 may be disposed on the first DQ connection pad region DCR1, and the first CA connection pads CC1 may be disposed on the first CA connection pad region CCR1. Similarly, the second, third, and fourth DQ connection pads DC2-DC4 may be disposed on the second, third, and fourth DQ connection pad regions DCR2-DCR4, respectively, and the second, third, and fourth CA connection pads CC2-CC4 may be disposed on the second, third, and fourth CA connection pad regions CCR2-CCR4, respectively.

The first DQ connection pads DC1 may be connected to the first data pads DP1 of the logic chip 10 through the internal wires IC. The first CA connection pads CC1 may be connected to the first command/address pads CP1 of the logic chip through the internal wires IC. The second DQ connection pads DC2 may be connected to the second data pads DP2 of the logic chip 10 through the internal wires IC. The second CA connection pads CC2 may be connected to the second command/address pads CP2 of the logic chip 10 through the internal wires IC. The third DQ connection pads DC3 may be connected to the third data pads DP3 of the logic chip 10 through the internal wires IC. The third CA connection pads CC3 may be connected to the third command/address pads CP3 of the logic chip 10 through the internal wires IC. The fourth DQ connection pads DC4 may be connected to the fourth data pads DP4 of the logic chip 10 through the internal wires IC. The fourth CA connection pads CC4 may be connected to the fourth command/address pads CP4 of the logic chip 10 through the internal wires IC.

In some embodiments, the first, second, third, and fourth DQ connection pads DC1, DC2, DC3, and DC4 may be coupled to the first, second, third, and fourth command/address pads DP1, DP2, DP3 and DP4, respectively, via suitable connection techniques other than using the internal wires IC. For example, conductive patterns may be formed on the top surface of the first package substrate 101. Also, the first, second, third, and fourth CA connection pads CC1, CC2, CC3, and CC4 may be coupled to the first, second, third, and fourth command/address pads CP1, CP2, CP3 and CP4, respectively, via suitable connection techniques other than internal wires IC.

Furthermore, the first semiconductor package 100 may include a first molding layer 110 covering the logic chip 10. The first molding layer 110 may be under-filled between the first package substrate 101 and the logic chip 10. The first molding layer 110 may include an epoxy molding compound. The first molding layer 110 may be formed to expose the connection pads DC1-DC4 and CC1-CC4 of the first package substrate 101. It is understood that the above are merely a few illustrative examples to which the disclosed subject matter is not limited.

Figure 5:
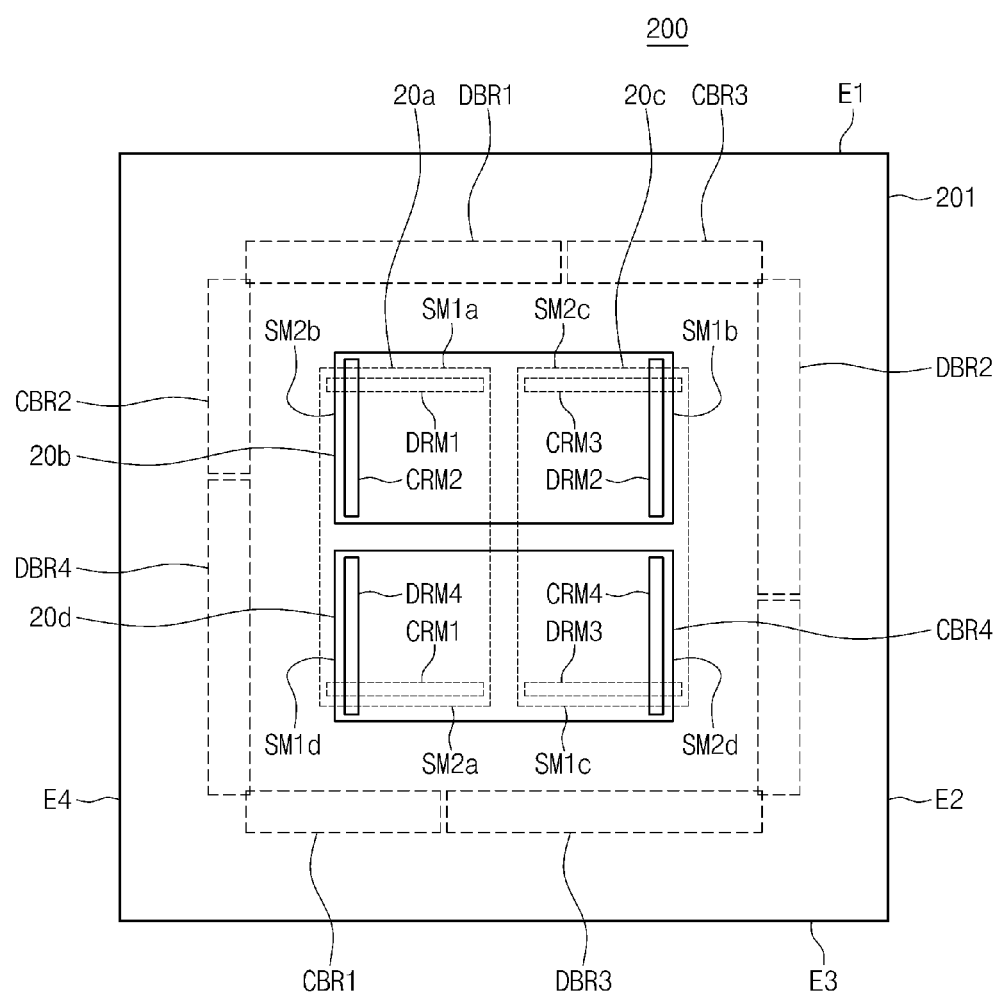
FIG. 5 is a schematic plan view of a second semiconductor package according to example embodiments of the disclosed subject matter.

FIG. 5 is a schematic plan view of a second semiconductor package according to example embodiments of the disclosed subject matter.

Referring to FIG. 5, a second semiconductor package 200 may include a second package substrate 201 and first, second, third, and fourth memory chips 20a, 20b, 20c, and 20d mounted on the second package substrate 201.

In example embodiments, the first and third memory chips 20a and 20c may be mounted side by side on a top surface of the second package substrate 201. The second and fourth memory chips 20b and 20d may be mounted side by side on the first and third memory chips 20a and 20c.

In each of the first, second, third, and fourth memory chips 20a, 20b, 20c, and 20d, and the data pads DP1-DP4 may be arranged spaced apart from the command/address pads CP1-CP4. For example, each of the first, second, third, and fourth memory chips 20a, 20b, 20c, and 20d may include first and second side surfaces that are opposite each other. The first memory chip 20a may include a first side surface SM1a and a second side surface SM2a. Likewise, the second, third, and fourth memory chips 20b, 20c, and 20d may include first side surfaces SM1b, SM1c, and SM1d (respectively), and second side surfaces SM2b, SM2c, and SM2d (respectively). For each memory chip 20a, 20b, 20c, and 20d, a data pad region DR (e.g., DRM1, DRM2, DRM3, and DRM4) may be disposed adjacent to the respective first side surface and a command/address pad region CR (e.g., CRM1, CRM2, CRM3, and CRM4) may be disposed adjacent to the respective second side surface.

In example embodiments, the first, second, third, and fourth memory chips 20a, 20b, 20c, and 20d may be configured to have the same operational properties. For example, all of the first, second, third, and fourth memory chips 20a, 20b, 20c, and 20d may include a 32 or 64 bits mobile DRAM device. It is understood that the above are merely a few illustrative examples to which the disclosed subject matter is not limited.

The second package substrate 201 may include first, second, third, and fourth edges E1, E2, E3, and E4, where the first and second edges E1 and E2 are substantially perpendicular to each other. The first and third edges E1 and E3 may be opposite each other, and the second and fourth edges E2 and E4 may be opposite each other.

Referring further to FIG. 5, the second package substrate 201 may include first, second, third, and fourth DQ bonding pad regions DBR1, DBR2, DBR3, and DBR4 and first, second, third, and fourth CA bonding pad regions CBR1, CBR2, CBR3, and CBR4.

In example embodiments, the first DQ bonding pad region DBR1 and the first CA bonding pad region CBR1 may be disposed opposite each other. The first DQ bonding pad region DBR1 may be disposed adjacent to the first edge E1, and the first CA bonding pad region CBR1 may be disposed adjacent to the third edge E3. The second DQ bonding pad region DBR2 and the second CA bonding pad region CBR2 may be disposed opposite each other. The second DQ bonding pad region DBR2 may be disposed adjacent to the second edge E2, and the second CA bonding pad region CBR2 may be disposed adjacent to the fourth edge E4. The third DQ bonding pad region DBR3 and the third CA bonding pad region CBR3 may be disposed opposite each other. The third DQ bonding pad region DBR3 may be disposed adjacent to the third edge E3, and the third CA bonding pad region CBR3 may be disposed adjacent to the first edge E1. The fourth DQ bonding pad region DBR4 and the fourth CA bonding pad region CBR4 may be disposed opposite each other. The fourth DQ bonding pad region DBR4 may be disposed adjacent to the fourth edge E4, and the fourth CA bonding pad region CBR4 may be disposed adjacent to the second edge E2. Furthermore, each of the first, second, third, and fourth DQ bonding pad regions DBR1-DBR4 may each have an area that is greater than that of the corresponding one of the first, second, third, and fourth CA bonding pad regions CBR1-CBR4.

In example embodiments, the first and third memory chips 20a and 20c may be mounted on the second package substrate 201, in such a way that, in plan view, the data pad region DRM3 of the third memory chip 20c is disposed on a substantially diagonal, perpendicular, or orthogonal direction with respect to the data pad region DRM1 of the first memory chip 20a. Similarly, the command/address pad region CRM3 of the third memory chip 20c may be disposed on a substantially diagonal, perpendicular, or orthogonal direction with respect to the command/address pad region CRM1 of the first memory chip 20a. In other words, the data pad region DRM1 of the first memory chip 20a and the command/address pad region CRM3 of the third memory chip 20c may be disposed adjacent to the first edge E1 of the second package substrate 201.

The data pad region DRM1 of the first memory chip 20a may be disposed adjacent to the first DQ bonding region DBR1, and the command/address pad region CRM1 of the first memory chip 20a may be disposed adjacent to the first CA bonding region CBR1. The data pad region DRM3 of the third memory chip 20c may be disposed adjacent to the third DQ bonding region DBR3, and the command/address pad region CRM3 of the third memory chip 20c may be disposed adjacent to the third CA bonding region CBR3.

In example embodiments, the second and fourth memory chips 20b and 20d may be stacked on top surfaces of the first and third memory chips 20a and 20c. Here, the second and fourth memory chips 20b and 20d may be rotated 90 degrees with respect to the first and third memory chips 20a and 20c. For example, the data pad region DRM2 of the second memory chip 20b and the command/address pad region CRM4 of the fourth memory chip 20d may be disposed adjacent to the second edge E2 of the second package substrate 201. Further, in plan view, the data pad region DRM4 of the fourth memory chip 20d may be disposed on a substantially diagonal, perpendicular, or orthogonal direction with respect to the data pad region DRM2 of the second memory chip 20b. Similarly, the command/address pad region CRM4 of the fourth memory chip 20d may be disposed on a substantially diagonal, perpendicular, or orthogonal direction with respect to the command/address pad region CRM2 of the second memory chip 20b.

In addition, the data pad region DRM2 of the second memory chip 20b may be disposed adjacent to the second DQ bonding region DBR2, and the command/address pad region CRM2 of the second memory chip 20b may be disposed adjacent to the second CA bonding region CBR2. The data pad region DRM4 of the fourth memory chip 20d may be disposed adjacent to the fourth DQ bonding region DBR4, and the command/address pad region CRM4 of the fourth memory chip 20d may be disposed adjacent to the fourth CA bonding region CBR4.

Figure 6:
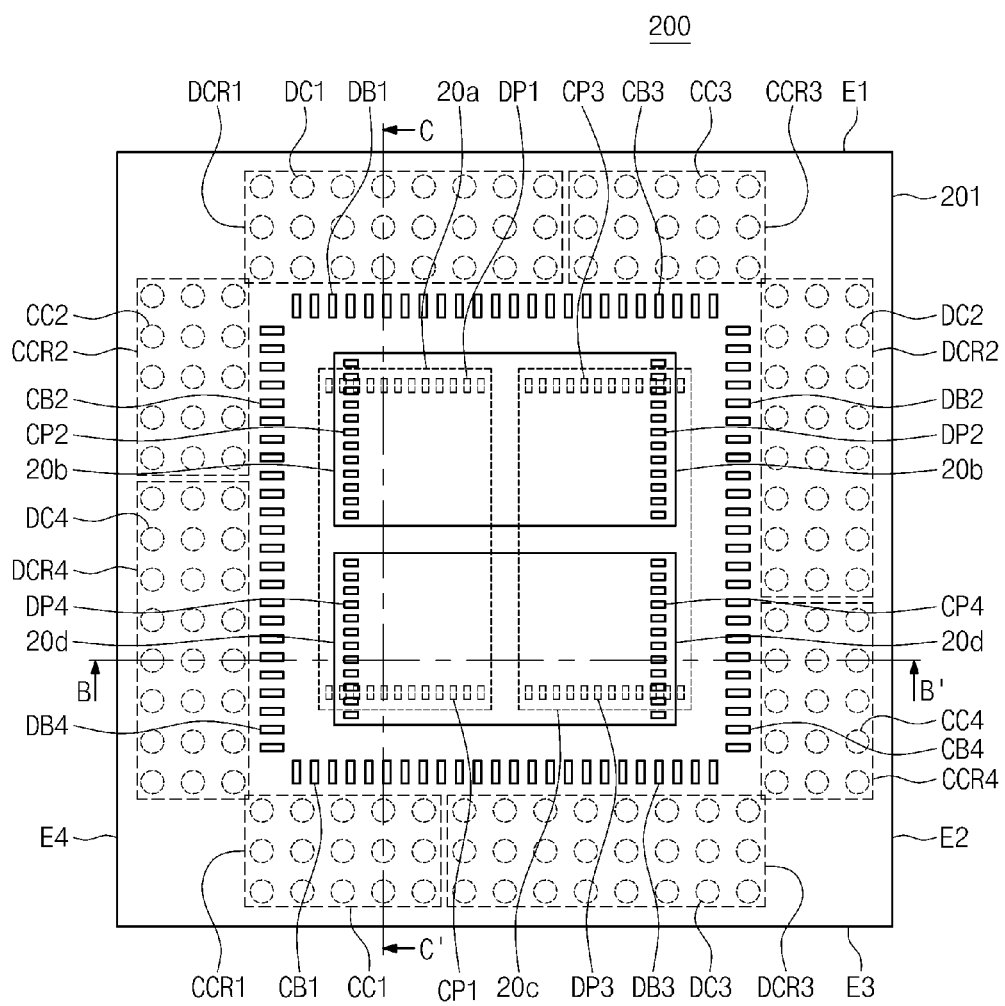
FIG. 6 is a plan view illustrating the second semiconductor package according to example embodiments of the disclosed subject matter.
Figure 7:
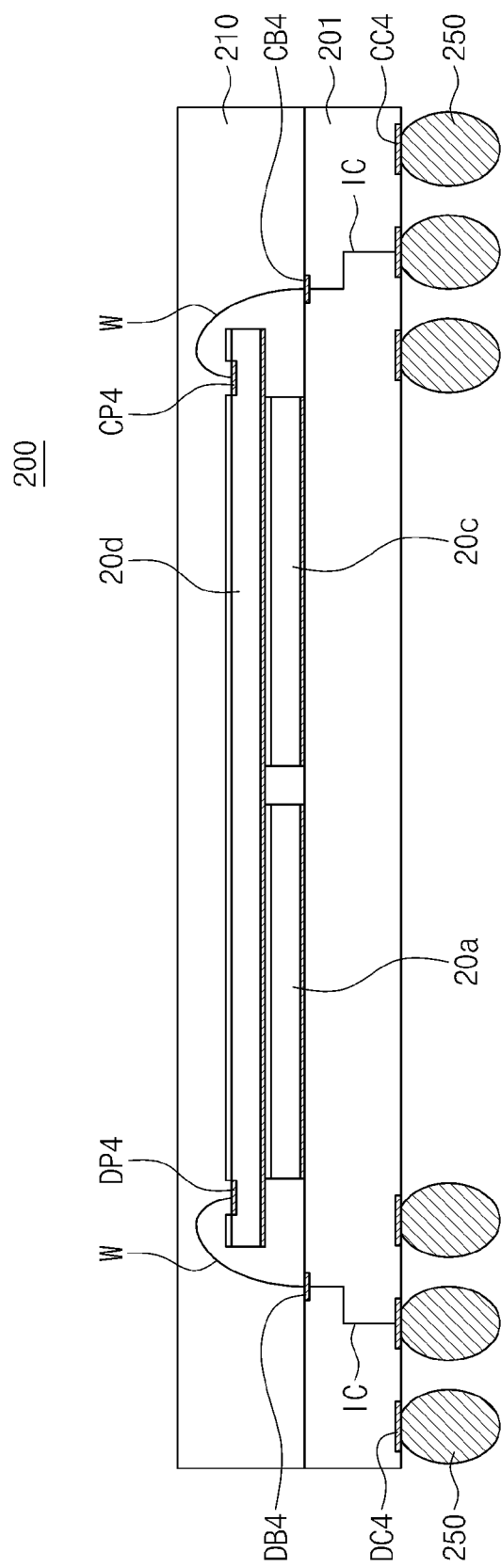
FIG. 7 is a sectional view taken along a line B-B' of FIG. 6 to illustrate the second semiconductor package according to example embodiments of the disclosed subject matter.
Figure 8:
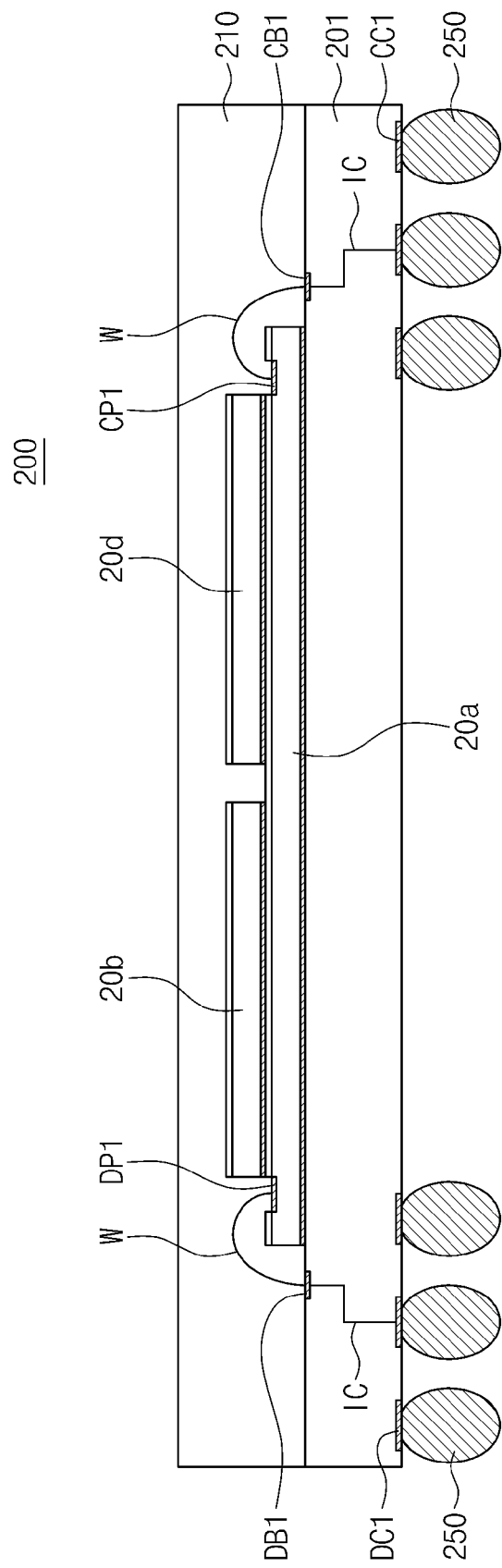
FIG. 8 is a sectional view taken along a line C-C' of FIG. 6 to illustrate the second semiconductor package according to example embodiments of the disclosed subject matter.

FIG. 6 is a plan view illustrating the second semiconductor package according to example embodiments of the disclosed subject matter. FIG. 7 is a cross-sectional view taken along a line B-B' of FIG. 6 to illustrate the second semiconductor package according to example embodiments of the disclosed subject matter. FIG. 8 is a cross-sectional view taken along a line C-C' of FIG. 6 to illustrate the second semiconductor package according to example embodiments of the disclosed subject matter.

Referring to FIGS. 6, 7, and 8, the second semiconductor package 200 may include the first, second, third, and fourth memory chips 20a, 20b, 20c, and 20d mounted on the second package substrate 201.

Each of the first, second, third, and fourth memory chips 20a, 20b, 20c, and 20d may include data pads DP1, DP2, DP3, and DP4, which may be used to input and output data signals, command/address pads CP1, CP2, CP3, and CP4, which may be used to input and output command and address signals (such as data strobe signals, data mask signals, chip selection signals, clock signals, write enable signals, RAS signals, or CAS signals), and power and ground pads to be applied with power and ground voltages. Here, the data pads DP1-DP4 may be disposed on the data regions DRM1-DRM4 (e.g., in FIG. 5) of the first, second, third, and fourth memory chips 20a-20d, and the command/address pads CP1-CP4 may be disposed on the command/address regions CRM1-CRM4 (e.g., in FIG. 5) of the first, second, third, and fourth memory chips 20a-20d.

Referring further to FIGS. 6, 7, and 8, a variety of substrates, such as a printed circuit board, a flexible substrate, and a tape substrate, may be used as the second package substrate 201. In example embodiments, the second package substrate 201 may include one of a flexible printed circuit board, a rigid printed circuit board, or combinations thereof, in which internal wires IC are provided.

The second package substrate 201 may have a top surface and a bottom surface and include bonding pads DB1-DB4 and CB1-CB4, internal wires IC, and connection pads DC1-DC4 and CC1-CC4. The bonding pads DB1-DB4 and CB1-CB4 may be arranged on the top surface of the second package substrate 201, and the connection pads DC1-DC4 and CC1-CC4 may be arranged on the bottom surface of the second package substrate 201. Further, the first, second, third, and fourth memory chips 20a-20d may be disposed on a central region of the second package substrate 201.

In example embodiments, the bonding pads DB1-DB4 and CB1-CB4 may include the first, second, third, and fourth DQ bonding pads DB1-DB4, which may be connected to the data pads DP1-DP4 of the first, second, third, and fourth memory chips 20a-20d through the wires W, and the first, second, third, and fourth CA bonding pads CB1-CB4, which may be connected to the command/address pads CP1-CP4 of the first, second, third, and fourth memory chips 20a-20d through the wires W. The connection pads may include the first, second, third, and fourth DQ connection pads DC1-DC4, which may be connected to the first, second, third, and fourth DQ bonding pads DB1-DB4 through the internal wires IC, and the first, second, third, and fourth CA connection pads CC1-CC4, which may be connected to the first, second, third, and fourth CA bonding pads CB1-CB4 through the internal wires IC.

For example, the first DQ bonding pads DB1 may be disposed on the first DQ bonding pad region DBR1 of the second package substrate 201 described with reference to FIG. 5, and the first CA connection pads CB1 may be disposed on the first CA connection pad region CBR1. Similarly, the second to fourth DQ bonding pads DB2-DB4 may be disposed on the second, third, and fourth DQ bonding pad regions DBR2-DBR4, respectively, and the second, third, and fourth CA connection pads CB2-CB4 may be provided on the second, third, and fourth CA connection pad regions CBR2-CBR4, respectively.

In example embodiments, the first and third memory chips 20a and 20c may be mounted on the top surface of the second package substrate 201, in such a way that the data pads DP1 of the first memory chip 20a may be disposed adjacent to the first edge E1 of the second package substrate 201 and the data pads DP3 of the third memory chip 20c may be disposed adjacent to the third edge E3 of the second package substrate 201.

The second and fourth memory chips 20b and 20d may be attached on top surfaces of the first and third memory chips 20a and 20c using an adhesive layer. In example embodiments, the data pads DP2 of the second memory chip 20b may be disposed adjacent to the second edge E2 of the second package substrate 201, and the data pads DP4 of the fourth memory chip 20d may be disposed adjacent to the fourth edge E4 of the second package substrate 201.

Furthermore, the second semiconductor package 200 may include a second molding layer 210 covering the first, second, third, and fourth memory chips 20a-20d. The second molding layer 210 may be under-filled between the second package substrate 201 and the first and third memory chips 20a and 20c. The second molding layer 210 may include an epoxy molding compound. It is understood that the above are merely a few illustrative examples to which the disclosed subject matter is not limited.

Figure 9:
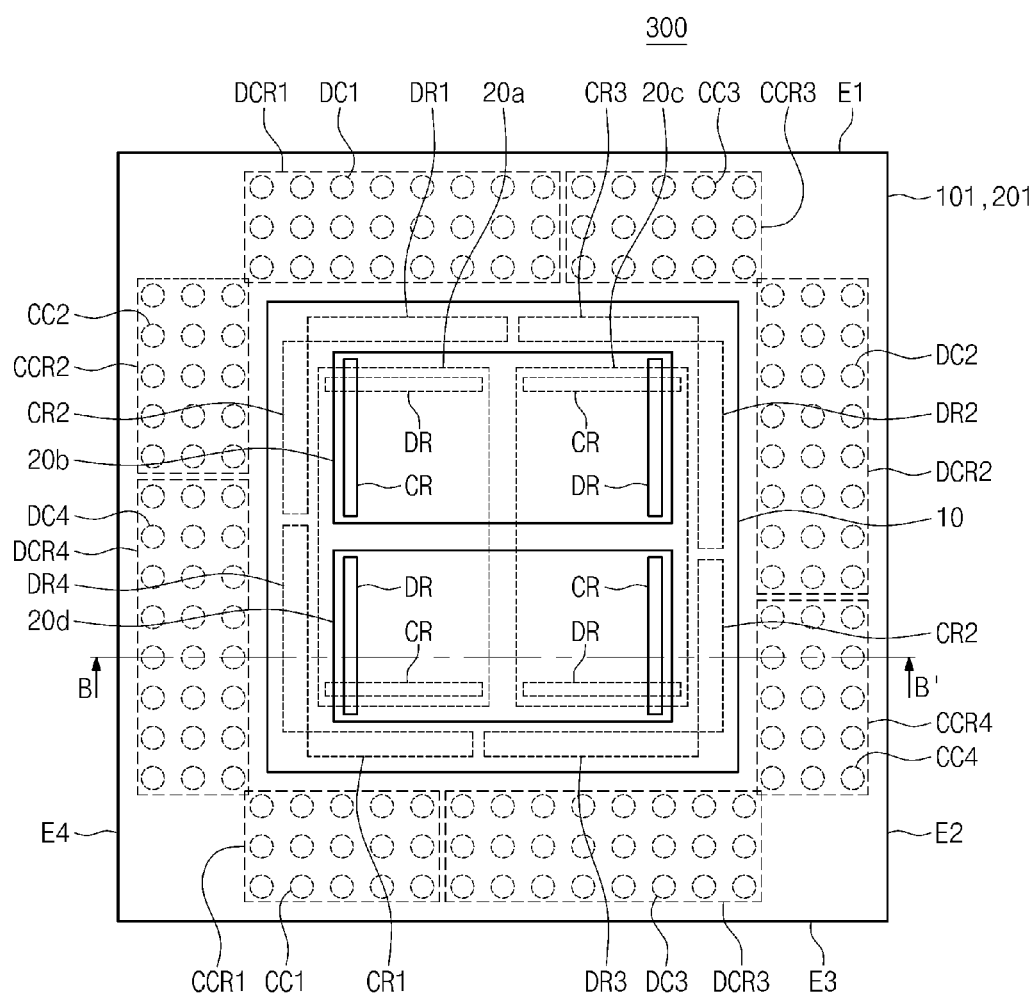
FIG. 9 is a schematic plan view of a stack-type semiconductor package according to example embodiments of the disclosed subject matter.
Figure 10:
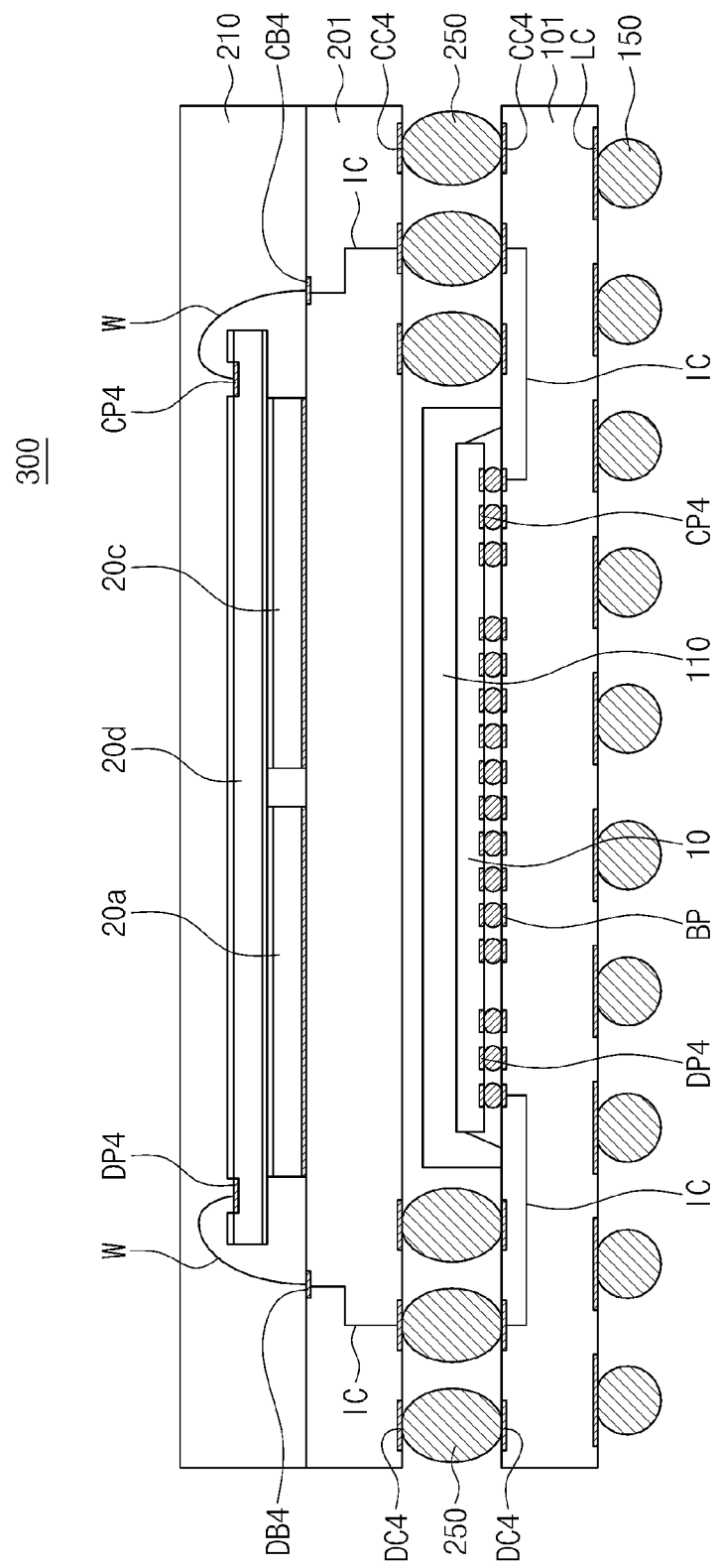
FIG. 10 is a sectional view taken along a line D-D' of FIG. 9 to illustrate a stack-type semiconductor package according to example embodiments of the disclosed subject matter.

FIG. 9 is a schematic plan view of a stack-type semiconductor package according to example embodiments of the disclosed subject matter. FIG. 10 is a cross-sectional view taken along a line D-D' of FIG. 9 to illustrate a stack-type semiconductor package according to example embodiments of the disclosed subject matter.

Referring to FIGS. 9 and 10, the second semiconductor package 200 may be stacked on the first semiconductor package 100.

As described with reference to FIGS. 2, 3, and 4, the first semiconductor package 100 may include the logic chip 10 with the first, second, third, and fourth channels. As described with reference to FIGS. 5 through 8, the second semiconductor package 200 may include the first, second, third, and fourth memory chips 20a-20d, which may be stacked in a vertical direction and be generally arranged side by side in a horizontal direction.

The DQ connection pads DC1-DC4 of the first semiconductor package 100 may be electrically connected to the DQ connection pads DC1-DC4 of the second semiconductor package 200, respectively, via the connection terminals 250. Further, the CA connection pads CC1-CC4 of the second semiconductor package 200 may be electrically connected to the CA connection pads CC1-CC4 of the second semiconductor package 200, respectively, via the connection terminals 250. The outer connection terminals 150 may be attached on the lower connection pads LC, which may be disposed on the bottom surface of the first package substrate 101. This stack-type semiconductor package 300 may be connected to an external electronic device through the outer connection terminals 150.

In example embodiments, the second semiconductor package 200 may be stacked on the first semiconductor package 100, in such a way that the first DQ connection pads DC1 and the first CA connection pads CC1 connected to the first memory chip 20a are disposed opposite each other and the third DQ connection pads DC3 and the third CA connection pads CC3 connected to the third memory chip 20c are disposed opposite each other. This makes it possible to simplify an interconnection structure between the data pads DP1 and DP3 of the first and third memory chips 20a and 20c and the first and third data pads DP1 and CP3 of the logic chip 10.

Furthermore, since the second and fourth DQ connection pads DC2 and DC4 of the first and second package substrates 101 and 201 may be arranged adjacent to the second and forth edges E2 and E3 of the first and second package substrates 101 and 201, it is possible to reduce signal path lengths between the data pads DP2 and DP4 of the second and fourth memory chips 20b and 20d and the second and fourth data pads DP2 and DP4 of the logic chip 10.

Furthermore, since, in the second semiconductor package 200, the first and third memory chips 20a and 20c may be disposed side by side, and the second and fourth memory chips 20b and 20d may be stacked side by side on top of the first and third memory chips 20a and 20c, it is possible to reduce a vertical thickness of the stack-type semiconductor package 300.

Figure 11:
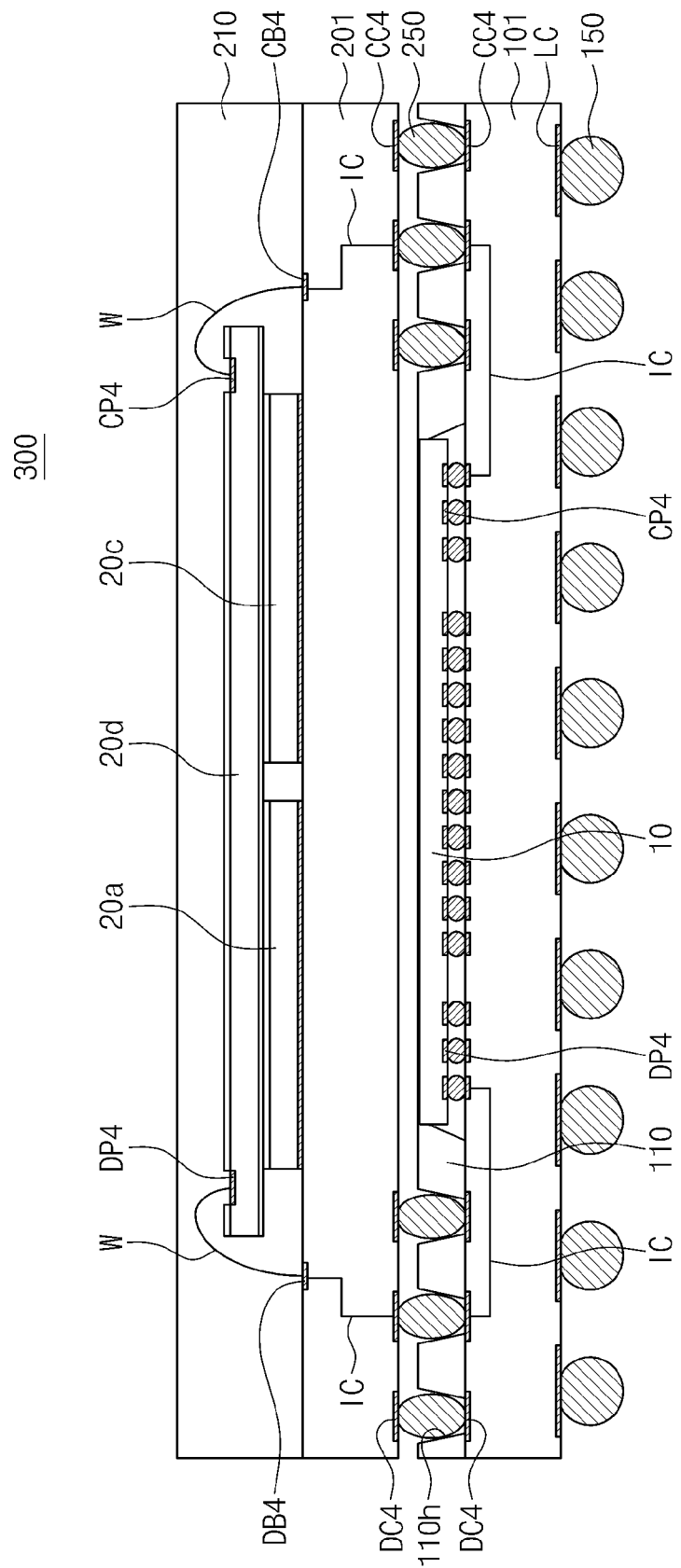
FIGS. 11 and 12 are sectional views taken along a line D-D' of FIG. 9 to illustrate stack-type semiconductor packages according to other example embodiments of the disclosed subject matter.
Figure 12:
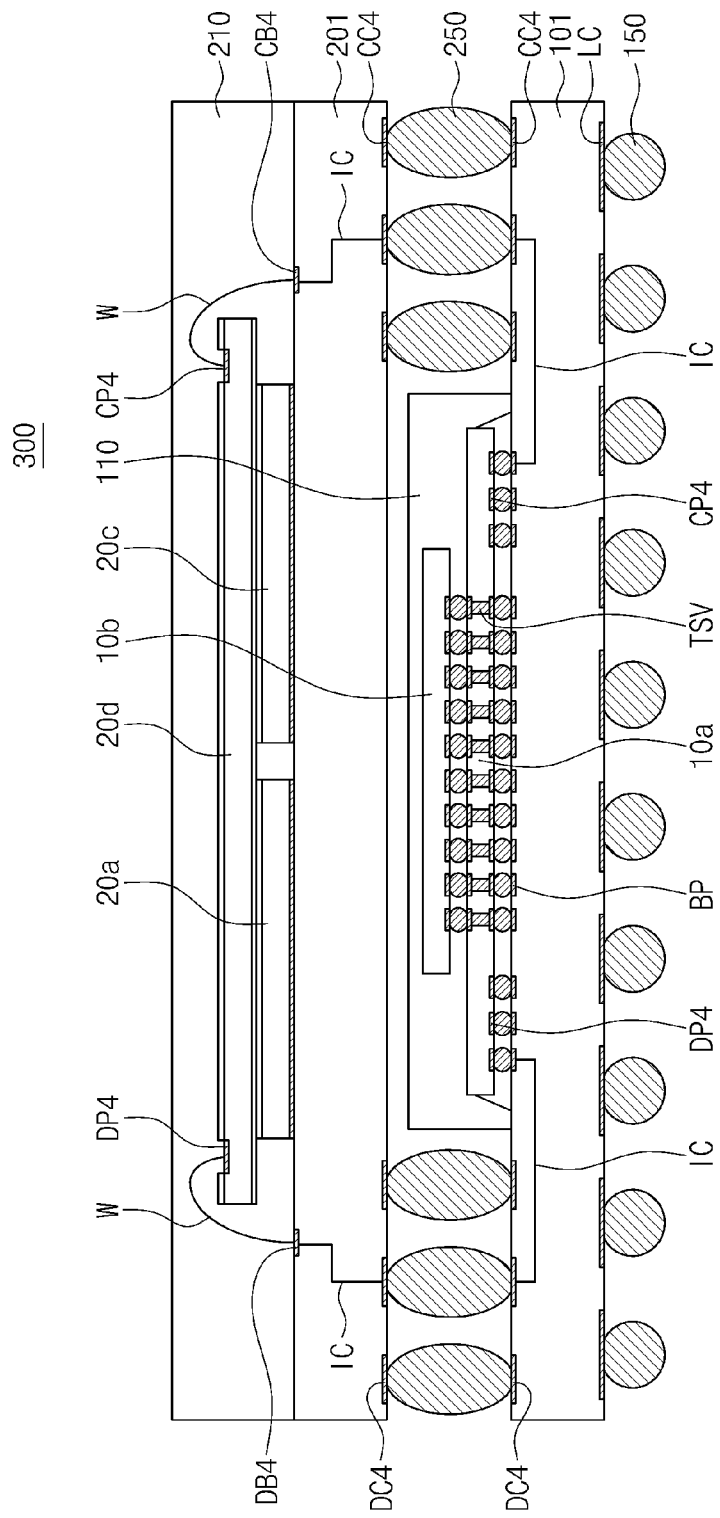

FIGS. 11 and 12 are cross-sectional views taken along a line D-D' of FIG. 9 to illustrate stack-type semiconductor packages according to other example embodiments of the disclosed subject matter.

According to the embodiment shown in FIG. 11, the first molding layer 110 of the first semiconductor package 100 may be formed to cover the first package substrate 101 mounted with the logic chip 10 and to have holes 110h exposing the connection pads DC1-DC4 and CC1-CC4, respectively. Accordingly, the connection terminals 250 attached on the connection pads DC1-DC4 and CC1-CC4 of the second package substrate 201 may be inserted into the holes 110h of the first molding layer 110 and thereby be electrically connected to the connection pads DC1-DC4 and CC1-CC4 of the first package substrate 101.

According to the embodiment shown in FIG. 12, the first semiconductor package 100 may include first and second logic chips 10a and 10b stacked on the first package substrate 101.

The first logic chip 10a may be mounted on the first package substrate 201 in a flip-chip bonding manner, and the second logic chip 10b may be mounted on the first logic chip 10a using through-silicon vias or through electrodes TSV.

In example embodiments, the first logic chip 10a may be a digital baseband modem chip, and the second logic chip 10b may be an analog baseband modem chip. It is understood that the above is merely one illustrative example to which the disclosed subject matter is not limited. The first logic chip 10a may be configured to have the same pad arrangement as that described with reference to FIGS. 2 and 3.

Figure 13:
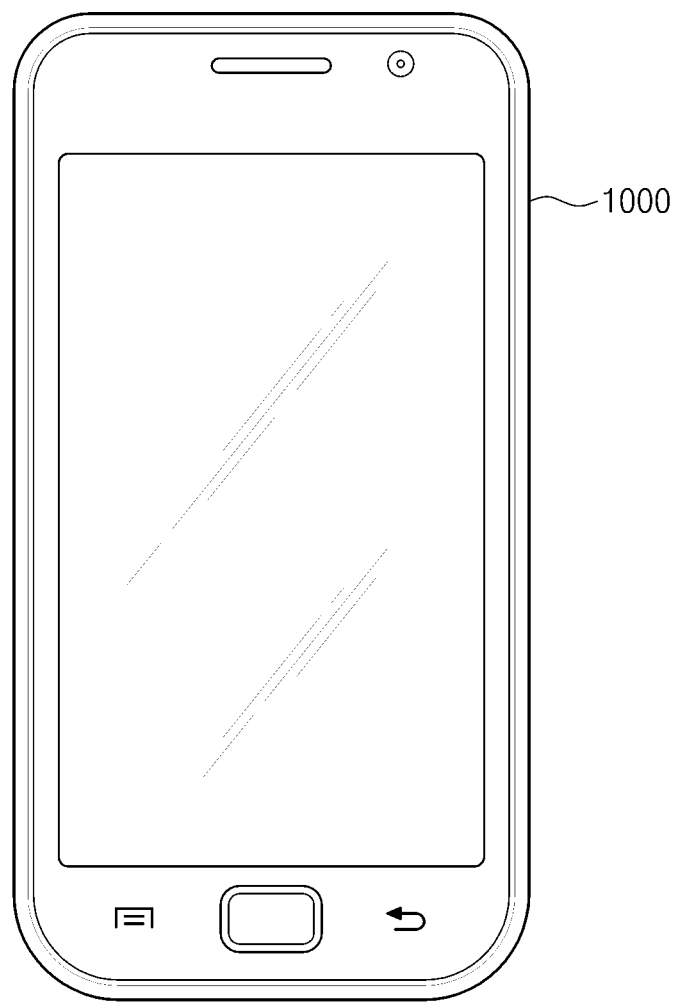
FIG. 13 is a diagram illustrating an example of electronic devices including the stack-type semiconductor package according to example embodiments of the disclosed subject matter.
Figure 14:
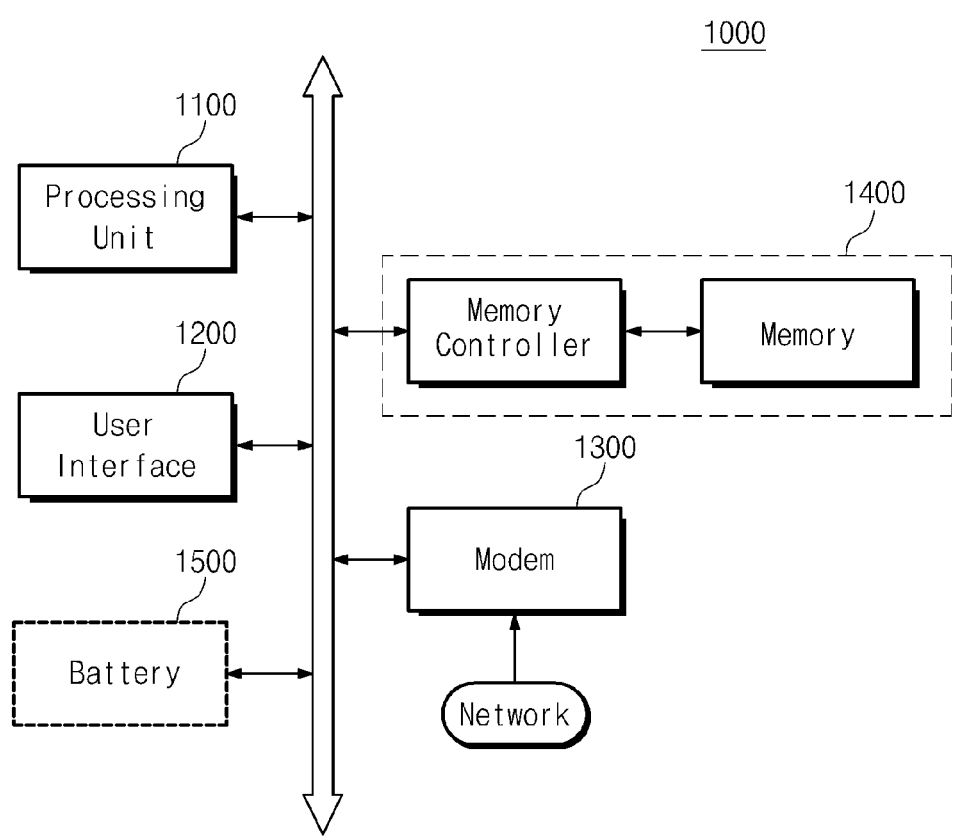
FIG. 14 is a block diagram illustrating an example of electronic devices including the stack-type semiconductor package according to example embodiments of the disclosed subject matter.

FIG. 13 is a diagram illustrating an example of electronic devices including the stack-type semiconductor package according to example embodiments of the disclosed subject matter. FIG. 14 is a block diagram illustrating an example of electronic devices including the stack-type semiconductor package according to example embodiments of the disclosed subject matter.

Referring to FIG. 13, the stack-type semiconductor package according to example embodiments of the disclosed subject matter may be used to realize a mobile phone 1000. Alternatively, the stack-type semiconductor package according to example embodiments of the disclosed subject matter may be used to realize a smart phone, a personal digital assistant (PDA), a portable multimedia player (PMP), a digital multimedia broadcast (DMB) device, a global positioning system (GPS), a handheld gaming console, a portable computer, a web tablet, a wireless phone, a digital music player, a memory card, or other electronic products, which may be configured to receive or transmit information data wirelessly.

Referring to FIG. 14, an electronic device 1000 according to example embodiments of the disclosed subject matter may include a micro-processor 1100, a user interface 1200, a modem 1300 (e.g., a baseband chipset), and a stack-type semiconductor package 1400, which may be configured to have the same features as those previously described with reference to FIGS. 1 through 12.

In the case where the electronic device 1000 is disposed for the mobile application, the electronic device 1000 may further include a battery 1500. Further, although not shown, the electronic device 1000 may further include other electronic components, such as an application chipset and a camera image processor (CIS), as will be obvious to skilled persons in the art.

According to example embodiments of the disclosed subject matter, each semiconductor package may include a plurality of memory chips and a logic chip, which may be connected to each other by a simplified wiring structure. As a result, it is possible to improve routability of the package and a data processing speed between the memory chip and the logic chip. Further, at least some of the memory chips may be disposed side by side, and thus, it is possible to reduce a total thickness of the semiconductor package.

While example embodiments of the disclosed subject matter have been particularly shown and described, it will be understood by one of ordinary skill in the art that variations in form and detail may be made therein without departing from the spirit and scope of the attached claims.

What is claimed is:

1. A stack-type semiconductor package, comprising:
   a first semiconductor package including:
      a first package substrate comprising a first edge and a second edge that is substantially perpendicular to the first edge, and
      a logic chip mounted on the first package substrate;
   a second semiconductor package including:
      a second package substrate disposed on the first semiconductor package,
      a first memory chip, and
      a second memory chip,
      wherein the first memory chip and the second memory chip stacked upon the second package substrate and electrically connected with the logic chip; and
   a plurality of connection pads disposed between the first package substrate and the second package substrate, and configured to connect the first and second semiconductor packages electrically with each other;
   wherein the first package substrate further comprises:
      a first data connection pad electrically connected with the first memory chip,
      a first command/address connection pad electrically connected with the first memory chip, a second data connection pad electrically connected with the second memory chip, and a second command/address connection pad electrically connected to the second memory chip; and wherein the first data connection pad is arranged adjacent to the first edge and the second data connection pad is arranged adjacent to the second edge.

2. The semiconductor package of claim 1, wherein the logic chip comprises:

a first data pad electrically connected with the first memory chip, a first command/address pad electrically connected with the first memory chip, a second data pad electrically connected to the second memory chip, and a second command/address pad electrically connected to the second memory chip, wherein the first data pad is disposed adjacent to the first data connection pad, and the second data pad is disposed adjacent to the second data connection pad.

3. The semiconductor package of claim 1, wherein the first data connection pad is disposed adjacent to the second command/address connection pad.

4. The semiconductor package of claim 1, wherein the first memory chip comprises:

a data pad, and a command/address pad that is disposed opposite the data pad of the first memory chip, and wherein the data pad and the command/address pad of the first memory chip are arranged substantially parallel to the first edge; and wherein the second memory chip comprises:

a data pad, and a command/address pad that is disposed opposite the data pad of the second memory chip, and wherein the data pad and the command/address pad of the second memory chip are arranged substantially parallel to the second edge.

5. The semiconductor package of claim 1, wherein the second semiconductor package further comprises:

a third memory chip mounted on the second package substrate and disposed at a side of the first memory chip; and a fourth memory chip stacked on the first memory chip and disposed at a side of the second memory chip.

6. The semiconductor package of claim 5, wherein the third memory chip comprises:

a data pad, and a command/address pad disposed opposite the data pad of the third memory chip, and wherein the data pad and the command/address pad of the third memory chip are arranged substantially parallel to the first edge; and wherein the fourth memory chip comprises:

a data pad, and a command/address pad disposed opposite the data pad of the fourth memory chip, and wherein the data pad and the command/address pad of the fourth memory chip are arranged substantially parallel to the second edge.

7. The semiconductor package of claim 5, wherein the first package substrate further comprises:

a third data connection pad and a third command/address connection pad, both electrically connected to the third memory chip; and a fourth data connection pad and a fourth command/address connection pad, both electrically connected to the fourth memory chip, wherein the third data connection pad is arranged adjacent to the first edge and the fourth data connection pad is arranged adjacent to the second edge.

8. The semiconductor package of claim 7, wherein the third data connection pad is disposed adjacent to the fourth command/address connection pad.

9. A stack-type semiconductor package, comprising:

a first semiconductor package including:

a first package substrate comprising a first edge and a second edge that is substantially perpendicular to the first edge, and a logic chip mounted on the first package substrate;

a second semiconductor package including:

a second package substrate disposed on the first semiconductor package, and at least four memory chips, each of the memory chips mounted on the second package substrate and electrically connected to the logic chip; and a plurality of connection pad disposed between the first package substrate and the second package substrate and configured to connect the first and second semiconductor packages electrically with each other;

wherein the logic chip comprises at least four data pads and at least four command/address pads, each electrically connected to a respective one of the at least four memory chips;

wherein a first data pad and a third command/address pad are both arranged adjacent to the first edge; and wherein a second data pad and a fourth command/address pad are both arranged adjacent to the second edge.

10. The semiconductor package of claim 9, wherein a first command/address pad is disposed opposite the first data pad, a third data pad is disposed opposite the third command/address pad, a second command/address pad is disposed opposite the second data pad, and a fourth data pad is disposed opposite the fourth command/address pad.

11. The semiconductor package of claim 9, wherein, when the semiconductor package is oriented in a plan view direction, the first data pad is disposed in a substantially diagonal direction with respect to a third data pad, and the second data pad is disposed in a substantially diagonal direction with respect to a fourth data pad.

12. The semiconductor package of claim 9, wherein the first data pads is disposed adjacent to the second command/address pad, and the third command/address pad is disposed adjacent to a fourth data pad.

13. The semiconductor package of claim 9, wherein the first package substrate comprises:

at least four data connection pads, and at least four command/address connection pads, wherein a first data connection pad of the first package substrate and a third command/address connection pad of the first package substrate are arranged adjacent to the first edge, and a second data connection pad of the first package substrate and a fourth command/address connection pad of the first package substrate are arranged adjacent to the second edge; and wherein the second package substrate comprises:
at least four data connection pads and at least four command/address connection pads,
wherein a first data connection pad of the second package substrate and a third command/address connection pad of the second package substrate are arranged adjacent to the first edge, and
a second data connection pad of the second package substrate and a fourth command/address connection pad of the second package substrate are arranged adjacent to the second edge.

14. The semiconductor package of claim 9, wherein each of the at least four memory chips comprises a data pad and a command/address pad disposed opposite each other; and
wherein a first memory chip and a second memory chip are mounted on a top surface of the second package substrate in such a way that the data pad of the first memory chip is disposed opposite the data pad of the second memory chip, and
wherein a third memory chip and a fourth memory chip are respectively stacked on top surfaces of the first memory chips and the second memory chips in such a way that the data pads of the third and fourth memory chips are disposed opposite each other and to be not parallel to the first and second data pads.

15. An apparatus comprising:
a first semiconductor package including:
a plurality of edges,
a logic chip, and
a plurality of pairs of connection pads, each pair of a connection pad comprising a data connection pad and a command/address connection pad, wherein each data connection pad of a pair of connection pads is disposed substantially adjacent to a respective edge of the first semiconductor package, and each command/address connection pad of the pair of connection pads is disposed substantially adjacent to a respective opposite edge of the first semiconductor package, and
a second semiconductor package including:
a plurality of memory chips; and
wherein each memory chip is electrically connected with the logic chip through a respective pair of connection pads.

16. The apparatus of claim 15, wherein the logic chip comprises:
a plurality of edges of the logic chip, and
a plurality of pairs of pads, each pair of pads comprising a data pad and a command/address pad, and
each data pad of a pair of pads is disposed substantially adjacent to a respective edge of the logic chip, and each command/address pad of the pair of pads is disposed substantially adjacent to a respective opposite edge of the logic chip.

17. The apparatus of claim 15, wherein the plurality of memory chips includes a bottom memory chip and a top memory chip;
wherein the top memory chip includes a data pad region of the top memory chip;
wherein the bottom memory chip includes a data pad region of the bottom memory chip; and
wherein the top memory chip is stacked, at least partially, upon the bottom memory chip such that the data pad region of the top memory chip is orthogonal to the data pad region of the bottom memory chip.

18. The apparatus of claim 15, wherein the second semiconductor package further includes:
a plurality of pairs of bonding regions, each pair of bonding regions comprising a data bonding region and a command/address bonding region; and
wherein each data bonding region of a pair of bonding regions is disposed substantially adjacent to a respective edge of the second semiconductor package, and each command/address bonding region of the pair of bonding regions is disposed substantially adjacent to a respective opposite edge of the second semiconductor package.

19. The apparatus of claim 18, wherein each memory chip includes a pair of pad regions, each pair of pad regions including a data pad region and a command/address pad region;
wherein each data pad region is disposed on an opposite edge of the respective memory chip from a corresponding command/address pad region; and
wherein the plurality of memory chips are arranged to align each respective pair of pad regions with a corresponding pair of bonding regions.

20. The apparatus of claim 18, wherein each data connection pad of the plurality of pairs of connection pads of the first semiconductor package is aligned with a corresponding data bonding region of the plurality of pairs of bonding regions of the second semiconductor package.

* * * * *